United States Patent [19]

Seymour

[11] Patent Number: 4,565,598
[45] Date of Patent: Jan. 21, 1986

[54] METHOD AND APPARATUS FOR CONTROLLING DIAMETER IN CZOCHRALSKI CRYSTAL GROWTH BY MEASURING CRYSTAL WEIGHT AND CRYSTAL-MELT INTERFACE TEMPERATURE

[75] Inventor: Robert S. Seymour, Adelaide, Australia

[73] Assignee: The Commonwealth of Australia, Canberra, Australia

[21] Appl. No.: 527,516

[22] PCT Filed: Dec. 22, 1982

[86] PCT No.: PCT/AU82/00216

§ 371 Date: Aug. 11, 1983

§ 102(e) Date: Aug. 11, 1983

[87] PCT Pub. No.: WO83/02464

PCT Pub. Date: Jul. 21, 1983

[30] Foreign Application Priority Data

Jan. 4, 1982 [AU] Australia ............................ PF2151

[51] Int. Cl.⁴ ...................... C30B 15/28; G06F 15/46
[52] U.S. Cl. ............................... 156/601; 156/617 SP; 422/109; 422/249; 364/500
[58] Field of Search .................. 156/601, 617 SP; 422/109, 249; 364/477, 500; 219/10.77

[56] References Cited

U.S. PATENT DOCUMENTS

| | | | |
|---|---|---|---|
| 2,908,004 | 10/1959 | Levinson | 156/601 |
| 3,241,925 | 3/1966 | Cakenberghe | 156/601 |
| 4,008,387 | 2/1977 | Green et al. | 156/601 |
| 4,032,389 | 6/1977 | Joyce | 156/601 |
| 4,058,429 | 11/1977 | Duncan et al. | 156/601 |
| 4,073,355 | 2/1978 | Schmidt et al. | 156/601 |

FOREIGN PATENT DOCUMENTS

| | | |
|---|---|---|
| 2516197 | 10/1976 | Fed. Rep. of Germany . |
| 26967 | 11/1908 | Japan .................. 156/601 |
| 52-104474 | 1/1977 | Japan . |
| 52-104473 | 1/1977 | Japan . |
| 52-106381 | 6/1977 | Japan . |
| 54-28280 | 2/1979 | Japan . |
| 56-45892 | 4/1981 | Japan . |
| 56-92195 | 7/1981 | Japan . |
| 1376665 | 12/1974 | United Kingdom . |
| 1434527 | 5/1976 | United Kingdom . |
| 1465191 | 2/1977 | United Kingdom . |
| 1478192 | 6/1977 | United Kingdom . |
| 1494342 | 12/1977 | United Kingdom . |

OTHER PUBLICATIONS

Valentino et al., Diameter Control of Czochralski Grown Crystals, Journal of Crystal Growth 26, No. 1, Nov. 1974, pp. 1–5.

"Automatic Diameter Control of Czochralski Grown Crystals," Journal of Crystal Growth 19 (1973), 187–192, North–Holland Publishing Co., by A. E. Zinnes, B. E Nevis and C. D. Brandle.

Satoh et al., "Automatic Control System for Czochralski Growth of Large Diameter LiNbO₃ Crystals;, *Fujitsu Scientific and Technical Journal*, pp. 93–113, (Mar. 1976).

Bardsley et al., "The Weighing Method of Automatic Czochralski Crystal Growth", Journal of Crystal Growth, vol. 40, pp. 21–28, (1977).

*Primary Examiner*—David L. Lacey
*Attorney, Agent, or Firm*—Cushman, Darby & Cushman

[57] ABSTRACT

Diameter control in an apparatus and method for growing crystals using the Czochralski technique is accomplished by progressively measuring both the temperature of the melt by a heat sensor and the weight of the residue of the melt in the crucible by a suitable weighing device. The weight measurement data is fed to microprocessor having a control algorithm. The microprocessor output and temperature measurement output are fed to a three-term temperature controller which regulates the temperature of the melt to thereby control automatically the diameter of the crystal. The relationship between an error in weight and the amount of temperature regulation is varied in accordance with a desired weight.

8 Claims, 4 Drawing Figures

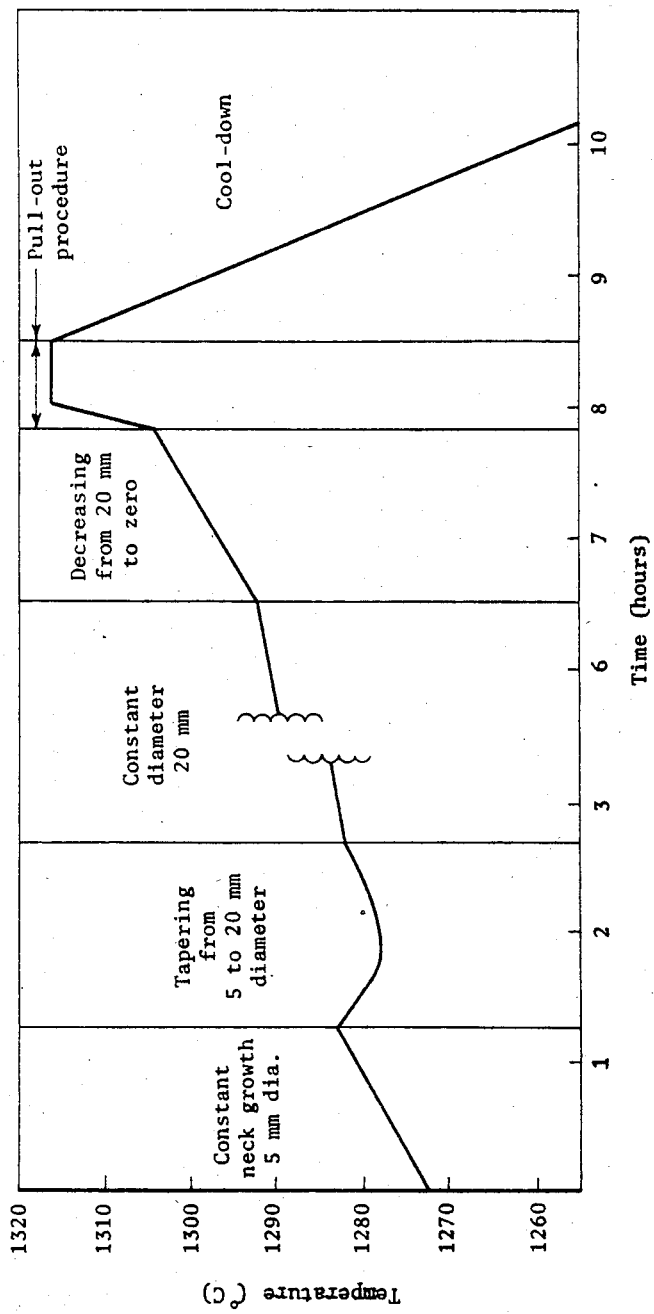

METHOD AND APPARATUS FOR CONTROLLING DIAMETER IN CZOCHRALSKI CRYSTAL GROWTH BY MEASURING CRYSTAL WEIGHT AND CRYSTAL-MELT INTERFACE TEMPERATURE

Crystal growth by the Czochralski method has traditionally required the presence of a skilled operator to watch the progress of a growing crystal and to affect diameter changes by making appropriate adjustments to the temperature of the melt. The relationship between melt temperature and crystal diameter depends on a balance between the sum of the heat passing from the melt to the crystal plus the heat of solidification with the heat that can be conducted away from the interface and lost to the environment. The qualitive relationship is that a melt temperature increase will cause a decrease in crystal diameter, but an exact relationship depends strongly on the existing crystal size and shape and will change throughout a growth run. To obtain good crystal quality it is necessary to maintain a constant growth rate as both stoichiometry and impurity concentration are growth rate sensitive. A closed loop servo type control over the crystal diameter is thus desirable to obtain good quality crystals reproducibly. Additional reasons for automatic control are that growth runs may last several hours to days making human supervision particularly tedious and that often visibility of the growing crystal is impaired by, for instance, thermal insulation in the growth chamber.

To achieve automatic control, some method of sensing the crystal diameter must replace the operator's vision. Many methods have been used, with that of weighing either the growing crystal or the melt plus crucible being the most popular and widely applicable. Weighing the crucible is mechanically simpler than weighing the crystal but crucible weighing does suffer the disadvantage that levitation effects from the r.f. heating and evaporation losses from the melt can contribute to the weight signal. Such effects, however, can be taken account of in signal processing.

Methods of using the processed weight signal to produce an appropriate influence on melt temperature such as to achieve servo control over the diameter, are known. The best approach is to first differentiate the weight signal, the result of which should be constant for constant diameter growth, and then compare this with an expected rate of change of weight. The error signal thus obtained can be used in a standard way to derive a control signal to adjust the melt temperature.

The electronic processing can be performed both by analogue and digital means. The analogue methods are considerably less expensive when compared with the cost of a mini-computer, but a digital control system is much more powerful because it allows easy modifications to control algorithms even during a growth run.

The following specifications show details of known prior art in this general field:

British Pat. No. 1,465,191, National Research Development Corporation which uses an r.f. heater supply unit to provide a melt and includes a load cell and draw position indicator to achieve a regulated crystal diameter by automatic means achieved through a system of heat control or draw regulation.

British Pat. No. 1,494,342, National Research Development Corporation which has a load cell associated with the pull rod and uses a differentiator and comparator.

Japanese Patent Specification No. 56-92195 Fujitsu K.K. et al, which uses a load cell connected to a computer through an A.D. converter, which computer is also connected to a power control to regulate the r.f. heating current.

The object of the invention however is to provide an improved method of and means for automatically producing crystals of a required diameter and this is achieved by measuring the temperature of the melt while also measuring the loss of weight of the melt. A microprocessor processes both factors to regulate the crystal growth conditions.

When the system, on which the present invention is based, is used without automatic diameter control, a standard Czochralski crystal puller is used, heating power to the crystal puller being provided by a low voltage industrial r.f. generator of say 50 kW capacity and operating at a nominal frequency of perhaps 450 kHz. The usual power sources in Czochralski facilities operate at higher voltages and have the power output controlled to a constant value by a closed loop system which samples r.f. power, but in our system the power output is controlled so as to keep a constant melt or crucible temperature. This is achieved by sampling temperature with an optical pyrometer the output of which is directed to an integrated three-term controller for comparison with a temperature set-point. A standard 4–20 mA output signal from the controller actuates a motor adjusting the output coupling of the r.f. generator and hence the power transformed to the crucible. The temperature at the monitoring point is controlled to better than 2° C. as indicated by the sensing head, and at the crystal-melt interface to better than $\frac{1}{8}$° C. as indicated by changes to crystal diameter. The system has a response time of the order of seconds. The manual operation of the facility requires a skilled operator to observe the growing crystal and to obtain the desired crystal shape by making appropriate changes to the temperature set-point.

Despite the excellence of the temperature control it is not practical to obtain automatic crystal growth by having the temperature set-point follow a predetermined programme for the following reasons:

(a) the complex relationship between temperature and crystal diameter depending on already grown crystal size means that any slight deviations in size during a run will invalidate a previously determined temperature-diameter measurement;

(b) the absolute temperature read by the sensor depends on the emissivity of the monitoring point and it is impractical to monitor the identical point in different growth runs;

(c) it would take several runs to obtain a desired diameter-temperature relationship which would then be useless if any change in crystal shape was required.

The automation of the Czochralski system according to this invention, using the weighing method of diameter control, has retained the temperature control feature described above. The weight of the crucible and melt is determined by an electronic balance, the digital output of which is fed directly to a microprocessor which processes the signal, compares it to a preprogrammed value and produces a control signal to adjust the temperature set-point of the three-term controller. Control of the melt temperature is still retained by the temperature sensor/controller loop which copes with any short term fluctuations in the r.f. power output.

The electronic balance used is preferably such that it is operated on the 0-2000 g range with sensitivity of the digital weight measurement of 0.1 of a gram. The balance is placed underneath the growth chamber and supports the crucible plus melt and any additional thermal insulation. Some care is needed in setting the crucible assembly on top of the connecting shaft to the balance, so that the shaft runs freely through the hole in the growth chamber. A locking nut allows the shaft plus its load to be held for removal of the balance or to facilitate crucible loading and also provides an air tight seal if purging of the atmosphere of the growth chamber is required prior to a growth run. Initial setting up also requires zeroing the balance by adding weights and using the electronic zeroing facility, and then offsetting by an amount greater than the expected weight loss of the melt during the growth run by simply adding such weight (typically 200 g) to the balance.

The invention is described with reference to the accompanying drawings in which:

FIG. 4 shows a temperature-against-time graph of a typical growth run.

Figure 1:
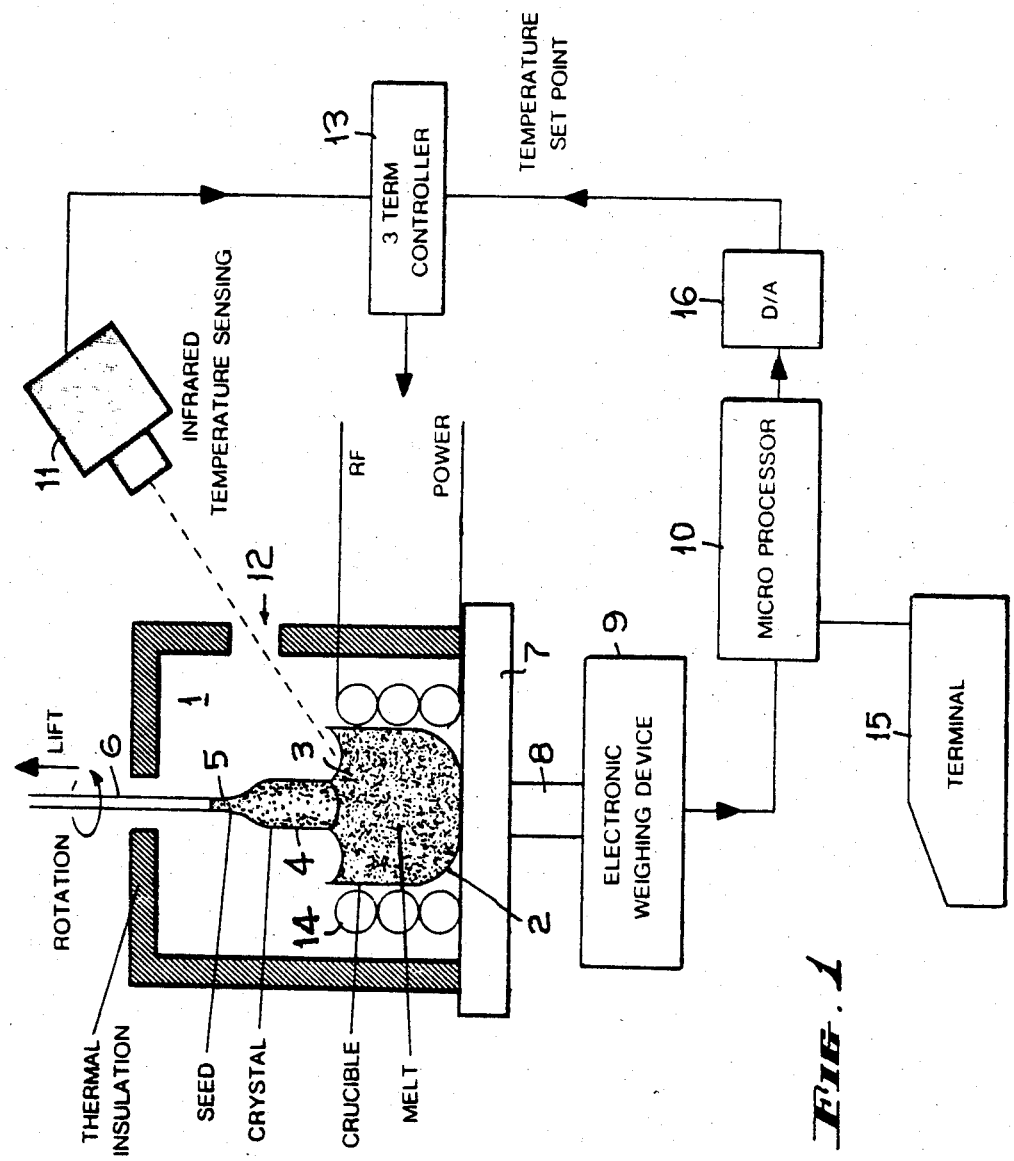
FIG. 1 is a block diagram showing the basic principle of the invention.

Referring first to FIG. 1, a chamber 1 has in it a crucible 2 containing the melt 3 from which the crystal 4 is drawn by means of a seed 5 on a pull-rod 6, the wall of the chamber 1 being supported on a chamber base 7.

A rod 8 transfers the weight of the crucible 2 and melt to an electronic weighing device or balance 9, the output of which is fed to a microprocessor 10.

The temperature of the melt 3 is sensed by an infrared temperature sensor 11 through a window 12 in the wall of the chamber 1, and the output is passed to a three term controller 13 which is connected to a radio-frequency heating coil 14 surrounding the crucible 2 and melt 3.

The microprocessor 10 is connected to a terminal 15 and the output of the microprocessor 10 is fed through a digital analogue converter 16 to the three term controller 13 so that the controller 13 is regulated by both the output of the infrared temperature sensor 11 and the output of the electronic weighing device 9.

The mechanism is further described with reference to FIG. 2 from which it will be seen that the crucible 3 is carried on a disc 20 secured to the top of the rod 8 which passes through a guide 21 in the base 7 and carries on it weights 22 to a selected value, the rod 8 transferring the weight of the crucible 2 and melt 3 together with its associated mechanism to the electronic weighing device 9 which is supported on a granite or other stable block 23.

The disc 20 carries on it a sleeve 25 which surrounds the crucible 2, the space between the crucible 2 and the sleeve 25 being filled with alumina balls 26.

The sleeve 25 has an apertured disc 27 intermediate its ends through which the crystal 4 is drawn, the space above the disc 27 having a cylindrical wall 28 in it and the space between it and the sleeve 25 is filled with thermal insulation 30.

TYPICAL FORM OF THE INVENTION

A digital display on the balance 9 indicates the weight, and according to this invention the output is made available in both digital and analogue form. The analogue output of the weight is directed to a chart recorder, not shown, and the digital signal is sent to the microprocessor 10.

The microprocessor system used may be based on the Intel 8080 using mainly Intel components. It is mounted on printed circuit cards which are accommodated in a standard size card rack. The microprocessor 10 is preferably located some four meters from the crystal growth chamber 1 and r.f. generator to lessen the possibility of r.f. interference, and the output from the balance is brought to the microprocessor 10 via a shielded cable and is fed onto the data bus by a 24-bit parallel interface chip. The control signal output from the microprocessor, the melt temperature set-point, exits in 12-bit digital form via an interface chip to a digital to analogue converter 16 (DAC). This produces an analogue signal in the 0-10 V range which is fed directly to the three-term controller 13.

The control software is stored in six EPROM'S (each 1K byte storage) and 256 bytes of random access memory (RAM) is required for variable storage during the running of the programme. The p.c. card system used for the mounting of the micro-processor components is such that one EPROM card will accommodate 16K of memory and one RAM card will hold 8K. Another card holds the microprocessor chip and associated timing and system control devices. Two more cards complete the system, one holding the two parallel I/O interface chips and the DAC and the other containing a serial I/O interface chip which connects to an external terminal for communication with a human operator.

BASIC THEORY OF THE WEIGHING METHOD

The relationship between the force experienced by a device monitoring the crystal or melt weight and the crystal radius has been discussed by W. Bardsley, et al "The weighing Method of Automatic Czochralski Crystal Growth" J. Cryst. Growth 40 (1977)—Ref 1—and by Van DiJk et al "Crystal diameter Control in Czochralski Growth" Acta Electronica 17, p45 (1974)—Ref 2—. As well as the force due to the mass of the crystal there are extra effects due to the surface tension between melt and crystal and buoyancy effects which depend on the position of the growth interface in relation to the mean melt level. These extra effects are particularly important in detecting changes in the crystal radius as a response to some melt temperature change. To appreciate the effects it is useful to restate some of the results of Ref 1. The force F experienced by the balance is the initial weight of the crucible assembly plus melt, $F_o$, less the weight of crystal pulled and the effects due to the weight of the meniscus of melt supported and the surface tension forces.

$$F = F_o - \int_0^t \rho_s g \pi r^2 v \, dt - \rho_L g \pi r^2 h - 2\pi r \gamma \tag{1}$$

$\rho_s$ and $\rho_L$ are the respective densities of solid and liquid and r is the crystal radius at time t. h is the height of the meniscus above the mean melt level and v is the crystal growth rate related to the pull rate $v_o$ by $$v = v_o - \dot{h} \quad (2)$$

where the dot denotes time derivative. The vertical component of surface tension $\gamma$ is related to the surface tension constant $\sigma$ by $$\gamma = \sigma \cos \theta \quad (3)$$

where the angle $\theta$ is the sum of the inclination of the crystal surface, $\theta_S$, and $\theta_L$, the angle of contact between solid and liquid when wetting is not complete. The crystal inclination angle relates the rate of change of radius to the crystal growth rate $$\tan \theta_s \times \dot{r}/(v_o - \dot{h}) \quad (4)$$

An expression for the meniscus height can be obtained theoretically and is $$h = [\beta(1 - \sin \theta) + (\beta \cos \theta / 4r)^2]^{\frac{1}{2}} - \beta \cos \theta / 4r \quad (5)$$

with $$\beta \times 2\sigma/\rho_L g. \quad (6)$$

For growth at a constant radius $r_o$ the rate of change of weight of the crucible is given by $$\dot{F}_{ref} = -\rho_s g \pi r^2 v_o \quad (7)$$

However if the crystal radius is changing there will be additional terms due to the change in meniscus height and the surface tension forces as described by equations (1) to (5) and these effects can be illustrated by linearising the equations with respect to the expected small deviation, $a = r - r_o$, from the desired crystal radius. Equations (3), (4) and (5) become $$\gamma = \gamma_o - \gamma_\theta \theta_S \quad (8)$$

$$v_o \theta_S = \dot{a} \quad (9)$$

$$h = h_o + (h_a/r_o) a - h_\theta \theta_S \quad (10)$$

Explicit expressions for the material constants $\gamma_o$, $\gamma_\theta$, $h_o$, $h_a$ and $h_\theta$ are given in Ref 1. Substituting (8), (9) and (10) into (1) gives the difference, E, between the actual rate of change of weight of the crucible and the expected rate of change in terms of the deviation from the expected radius $$E = \dot{F} - \dot{F}_{ref} = -2\pi r_o g \rho_s v (a + \eta \dot{a} - \lambda \ddot{a}) \quad (11)$$

with $$\eta = (2(\rho_L h_o + \gamma_o / r_o g) - (\rho_s - \rho_L) h_a)/2\rho_s v_o \quad (12)$$

and $$\lambda = r_o(2\gamma_\theta / r_o g - (\rho_s - \rho_L) h_\theta)/2\rho_s v_o^2 \quad (13)$$

$\eta$ and $\lambda$ are material constants, $\eta$ is always positive but $\lambda$ depends more strongly on the sign of $\rho_s - \rho_L$ (ref 1). If the liquid is denser than the solid (as it is for most semiconductors) then $\lambda$ is positive. The dependence of the error in expected rate of weight change on deviation of the crystal radius is complicated by the additional terms in $\dot{a}$ and $\ddot{a}$ in equation (11). For example an increase in crystal radius results in an increased rate of change of weight of crystal given by the first term in (11). The second term is the same sign as the first and would be beneficial in providing easier detection of a radius change by observing the recordal weight. The third term however can be either sign. If $\lambda$ is negative ($\rho_s > \rho_L$) then a beneficial effect is obtained whereas if it is positive ($\rho_s > \rho_L$) it can sometimes swamp the first two terms and produce an error signal of the wrong sign. Thus an increase in radius may first show up as a decreased rate of change of weight. The effect is due mainly to the well known fact that an increasing radius first reduces the meniscus height and, if the liquid is denser than the solid, produces less effective crystal weight. The anomaly is apparent with many semiconductor materials and is discussed fully with means of circumventing its effect in control applications in Ref 1. However, in cases where $\rho_s > \rho_L$, $\rho$ is negative and the third term adds to the other two providing extra signal for detecting radius changes.

The error signal as given by equation (11) can be used in a control algorithm to affect melt temperature changes to keep the crystal radius to a desired value. Thus in response to an error in radius the temperature of the melt is adjusted by $$\Delta T = AE + B\dot{E} + C \int_0^t E dt \quad (14)$$

with E the rate of weight change error as defined by equation (11). This is a typical "three-term" control function, with the parameters A, B and C to be chosen for optimum control. When (11) is used to relate E back to crystal radius error it is seen that terms proportional to the radius error, its derivative and integral are present in $\Delta T$ but that there are also some terms proportional to the second and third derivatives. These latter terms could be subtracted if they proved troublesome as they do for example in the growth of semiconductors, see Bardsley et al "The weighing method of Automatic Czochralski Crystal Growth Control Equipment" J. Cryst. Growth 40, 21, (1977) Ref 3.

The optimum control parameters A, B and C can be determined by trial and error methods on actual crystal growth runs or on numerically simulated runs. Numerical simulation requires values for all the material parameters used in equations (1) and (3) and in addition an expression describing the time response of the crystal radius to a step change in temperature. Existing attempts at deriving such an expression theoretically (ref. 1) have of necessity used somewhat crude approximations and the result cannot be relied upon for quantative use. Experimental determination of the crystal response of temperature change is straightforward for their particular situation. In the case of the growth of lithium niobate in the laboratory to be described later herein, the control parameters were laboriously optimised during several actual growth runs and this experience suggests that the development of a numerical simulation model should be undertaken if major changes to the growth situation are made which necessitate a reoptimisation of the control parameters.

The implementation of the control algorithm in software for an 8080 microprocessor was compiled on an IBM 370/168 computer for Intel's 8080 Assembly language and Intel's PL/M, a high level language very similar to IBM's PL/1, but with modifications and restrictions applicable to 8080 microprocessor use. The compilers reduced the higher level language codes to 8080 machine code which can be obtained as output on paper tape. This code was then written from the tape onto EPROMS using a microprocessor and locally available PROM programming hardware and software.

Most of the control programme was written in PL/M which provides ease of coding for such things as arithmetic expressions, nested looping, use of subroutines and communication with the operator terminal. However only integer arithmetic is allowed and care in coding to retain numerical precision is required. A restriction is that arithmetic is unsigned which accounts for the repeated sign testing using the subroutine SIGN and duplication of coding.

The control programme has four distinct modes. The first is an initialisation where the programme communicates with the operator, asking for input data about the crystal to be grown. After this the programme takes weight measurements, processes these and displays the average and derivative. At this time the operator inserts the seed into the melt, noting contact by a sudden decrease in weight on the balance's digital display, and initiates growth, adjusting temperature until the computer printout shows the rate of change of weight to be a constant value appropriate to a small diameter crystal. The programme is then sent into the control mode and the crystal is grown automatically, with the rate of weight change being controlled to a programmed reference value. The programme enters the completion mode when this reference value reaches zero and removes the crystal from the melt. A slow cool down of the growth chamber then completes the run.

Communication with the operator terminal was in a form that would be intelligible to an operator not familiar with hexadecimal notation or the programme details. Thus the programme sends prompting messages to the terminal at the start of a growth run requesting data concerning the desired crystal to be grown. The operator enters the data in ordinary decimal notation which is converted to binary by the assembly language routine BCD2B. As the run proceeds output data is periodically relayed to the terminal for the operator's interest and includes current values of crucible weight in grams, the rate of change of weight in grams per hour, the reference rate of change, the error (EI), its derivative (FI), its integral (INT), a running average error (QI), the change made in temperature (PK), a temperature ramp value (R) and the current temperature set-point (TEMP). All, except the last three which are in hexadecimal, are in decimal notation with the assembly language routines BCDOUT and B2BCD performing the output and conversion from binary. Much of the communication with the terminal ultimately depends on routines available in the Intel supplied SDK-80 Monitor programme which can be called from the PL/M programme using small linking assembly language routines.

The weight signal from the electronic balance is in BCD format and is converted to binary by the routine BCD2B. Sixteen readings are taken during preset time intervals and averaged to give the average weight during the interval. Timing is performed by counting machine cycles in a software loop and the time over which the weight is averaged is set by the approximate response time of the crystal radius to a step change in melt temperature. For the case to be described of the growth of lithium niobate the response time was measured to be of the order of 12 min and weight averaging time was chosen to be two minutes. As the rate of weight change is required for the error signal, the weight must be differentiated and this is accomplished by taking the slope of the least-squares line of best fit through the most recent five weight readings. If $F_5$ is the most recent weight then the least squares best estimate of the slope is $$\dot{F} = (2F_5 + F_4 - F_2 - 2F_1)/10\Delta t$$

where $\Delta t$ is the time interval of weight averaging. This procedure coupled with the weight averaging greatly reduces noise in the signal to be used for control but means that sudden real deviations of the crystal radius are not as readily detected. However this can be compensated for by using more derivative control as discussed later. The weight averaging and storing of the most recent five averages is performed by the software procedure AVERAGE and procedure W5421 gets the least-squares best estimate of the differential weight.

At the completion of each weight averaging period when in the control mode, a reference rate of change of weight is calculated, by the procedure REFERENCE, based on input information about the desired crystal shape, the crystal pull-rate, crystal density and crucible diameter. The programme allows for crystals with a constant diameter neck region (constant rate of weight change) followed by a linear increase in rate of weight change (parabolic increase in radius) to the main diameter region which again has a constant rate of weight change. At the completion of growth at this diameter a linear decrease in rate of weight change describes a taper-in to zero diameter. Values for the reference rate of weight change in the constant neck region (GREF1) and for the main diameter region (GREF2) are calculated at programme initialisation from the input data and the expression $$\dot{F}_{ref} = -\pi \rho_s v_o R^2 r^2/(R^2 - r^2)$$

where R is the crucible radius and enters the expression by consideration of the drop in melt level. At each entry to REFERENCE a counter, STEPNO, is examined to see whether the crystal is in the NECK, TAPER, MAIN$LENGTH or FINAL$TAPER regions and the reference is set to GREF1, incremented by INC1 set to GREF2, or decremented INC2 accordingly. INC1 and INC2 are calculated it programme initialisation to produce the required changes in diameter in the specified length of crystal.

The control algorithm was originally based on that used by Zinnes et al "Automatic diameter control of Czochralski Grown Crystals" J. Cryst. Growth 19, 187(1973) Ref. 4 and employs much of their notation but in the course of determining the optimum control parameters the algorithm was also modified extensively. The following description is of the final version of the algorithm.

The error signal EI is the difference between the reference rate of weight change of the crucible and the measured value. This is compared with a lower limit which is of the order of magnitude of the expected error in the weight signal and a control signal is generated only if the absolute value of EI is the greater. After some early trial runs it was recognised that strict proportional control was not appropriate, for instance a one gram per hour error in the neck region of the crystal where the reference rate was say 1 g/hour, required more control action than a 1 g/hour error when the crystal was in the main diameter region with a 20 g/hour reference. However if control was made proportional to the relative error and optimised for the neck region, then it would be insufficient for the main diameter region. A suitable compromise was to vary the proportionality 'constant' with the reference rate of weight change as $$A = T_1/(a + bF_{ref})$$

Typical values as used for lithium niobate growth were $a=1$ g/hour, $b=0.05$ and $T_1=0.5°$ C. It was also found desirable to limit the maximum amount of control and this is conveniently done by making the maximum allowable error to be $a+bF_{ref}$ such that for all errors greater than this the control is restricted to be $T_1$.

The derivative of the error signal FI is calculated simply as the difference between the two previous errors and is not divided by the time interval. As the control is applied in a single step after each weight measuring interval the B constant (equation (14) is independent of time interval when the derivative is defined in this way. The previous discussion on the proportional control signal applies as well to the derivative control signal, thus the maximum of the derivate is limited to a $bF_{ref}$ and the B 'constant' varies as $T_2/(a+bF_{ref})$.

The integral is calculated as the sum of errors and is restricted to a maximum of $\dot{F}_{ref}$. However, when the error changes sign the integral reverts to zero, simulating the 'anti-reset windup' facility in analogue control systems. The multiplying factor to generate the integral control signal varies as the inverse of $\dot{F}_{ref}$, $$C = B_2/\dot{F}_{ref}$$

The parameter $B_2$ however will depend on the timing interval chosen. Although the facility for integral control has been retained in the programme it has not been required to date in actual crystal growth runs.

The temperature change, (PK in the programme listing), is calculated as the $\Delta T$ in equation (14) and usually added to the temperature (TEMP) at the end of each weight averaging period. It is possible to apply the change in one step or gradually during the next weight averaging period with the option being offered at programme initialisation. The relationship of the number in the computer representing temperature and the real temperature is given by the procedure CONVERT. The computer number varies from 0 to FFFF H. The 12 most significant bits of this number are fed to the DAC which gives an analogue output of from 0 to 10 V which can adjust the set-point of the IRCON controller over its full range. Thus a change of less than 8 to TEMP will not affect the set-point but a change of 10 H gives 0.36° C. change to the set-point.

When the reference rate of weight change reaches zero at the end of the FINAL$TAPER section the programme enters the completion mode via the procedure REFERENCE. The pull-out strategy is to increase the melt temperature at a constant rate and monitor the weight until the rate of change is zero with zero derivative. The zero derivative requirement is important as the rate of change will go from negative to positive as the crystal grows in and the meniscus height increases. This pull-out procedure is very slow and often the actual pull-out has been accomplished by the operator manually increasing the lift rate after the rate of weight change has been positive for some time. However, it would be straightforward to have the microprocessor perform this increase of lift rate. Once the crystal is out of the melt the set-point is held constant for several minutes, the lift rate turned off and then the growth chamber slowly cooled by a programmed decrease in temperature set-point.

Several means are available of interrupting the control programme during a growth run. The most drastic of these is forcing a 'reset' on the microprocessor which then restarts at the beginning of the monitor programme at memory location 0. The peripheral interfaces are also reset, one effect of this being to send all the outputs high on the temperature set-point output and giving a full-scale set-point, clearly a dangerous procedure if the system is in the automatic temperature mode. A safer alternative is to use the external interrupt facilities of the microprocessor. A 'request for interrupt' signal accompanied by an RST7 instruction, (all highs), on the data bus has no effect on the peripheral interfaces but restarts the microprocessor at memory location 56 which contains a jump instruction in the SDK-80 monitor. The jump can be to an interrupt processing routine which can finally return to the control programme at the point of interruption and resume operation. An alternative to the interrupt processing routine is to jump back into the monitor programme which then stores current register values and allows the monitor functions to be used to examine and change control programme variables stored in RAM. Another monitor function, obtained by entering a G at the terminal, restarts the programme at the interrupted point with the altered variable values.

Two of the most common reasons for wanting to interrupt the control programme are to change the temperature set-point, particularly during the seed insertion phase, and to cause an early but orderly termination of the growth. Provision has been made in the software for interrupting for these purposes, by having a check made periodically to see if a character is pending from the operator terminal. If so, procedure SET$-POINT is invoked. If the character is a 'T', a new temperature set-point can be entered in degrees C. and decimal notation. If the character is an 'F' then the step counter is made very large such that on the next entry to REFERENCE the FINAL$TAPER section is begun to decrease the crystal diameter and terminate growth.

AUTOMATIC GROWTH OF LITHIUM NIOBATE CRYSTALS

Research into the crystal growth of lithium niobate had been conducted in this laboratory for some time and was beset with two major problems, these being a persistent brown coloration of the crystals and a very strong probability of the boule cracking during cool down after growth. The cracking problem results from a combination of the large anisotropy in thermal expansion coefficients for lithium niobate and the structural phase change at 1215° C., coupled with the excessive thermal gradients in the crystal growth chamber usually associated with r.f. heating. Low thermal gradients can be produced by considerable thermal insulation of the region immediately above the melt into which the crystal is pulled ('after-heating') but two additional problems then arise as vision of the growing crystal is obstructed and the low thermal gradients make the crystal diameter much more sensitive to melt temperature fluctuations and therefore difficult to control. There is further evidence that straight sided boules are less prone to crack than boules grown without tight diameter control. The brown coloration of the crystals is probably due to niobium being in a lower valence state than the +5 required in stoichiometric LiNbO$_3$. Possible reasons for this are that impurity metal ions of +2 or higher valency have displaced lithium in the crystal lattice or that there is a deficiency of oxygen in the crystal. Previous reports have indicated that annealing brown coloured lithium niobate crystals in an oxygen atmosphere removes the colour and our experience has shown that lighter colour crystals result with good 'after-heating'. The use of good 'after-heating' together with the weighing method of automatic diameter control offered the possibility of solutions to all of the above problems and led to the development of the diameter control system described in this report.

Figure 2:
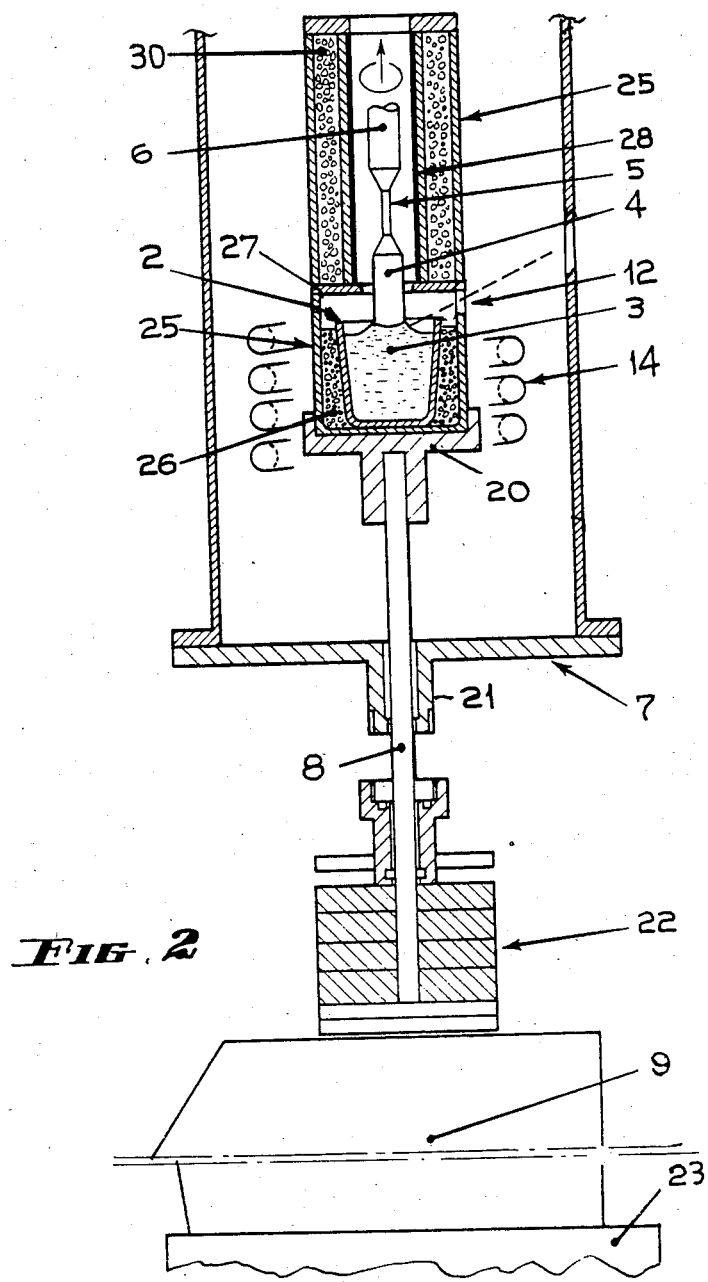
FIG. 2 is a transverse section of the mechanism for producing the crystal.

The experimental arrangement for the growth of lithium niobate was similar to that shown in FIGS. 1 and 2, with the balance weighing the whole after-heater assembly as well as the crucible and melt. A pure platinum crucible was used with growth temperatures of around 1300° C., and oxygen was bled into the growth chamber at 2 l/min. Crystals were pulled at rates of 10 mm/hour and 5 mm/hour with the slower speed giving the better results in terms of crack resistant crystals. Crystal rotation was 30 r/min. Seed orientations were either <111> or <310> in reciprocal rhombohedral coordinates. Starting chemicals were Optran zone refined lithium niobate at the congruent melting composition.

Several trial growth runs were required to determine suitable values for the control parameters. It was found that relatively large amounts of derivative control were needed whereas integral control and the constant term control were not required at all. The additional derivative control resulting from the terms in ä and ä in equation (11) has thus been beneficial in this case. There has been no need to apply any corrections for effects of crucible levitation or melt evaporation. With the low thermal gradients, the crystal diameter was very sensitive to temperature changes and as such, optimum values for the constants for proportional and derivative control were found to be $T_1 = 0.5°$ C. and $T_2 = 1.0°$ C. such that the largest possible response to a radius error was a 1.5° C. temperature change. The limitation on the maximum values of error and derivative and the variation of the proportionality 'constants' with reference rate of weight change was described previously and the (unoptimised) values used gave maximum values for error of 2 g/hour and 1 g/hour when the reference was 20 g/hour and 1 g/hour respectively.

Figure 3:
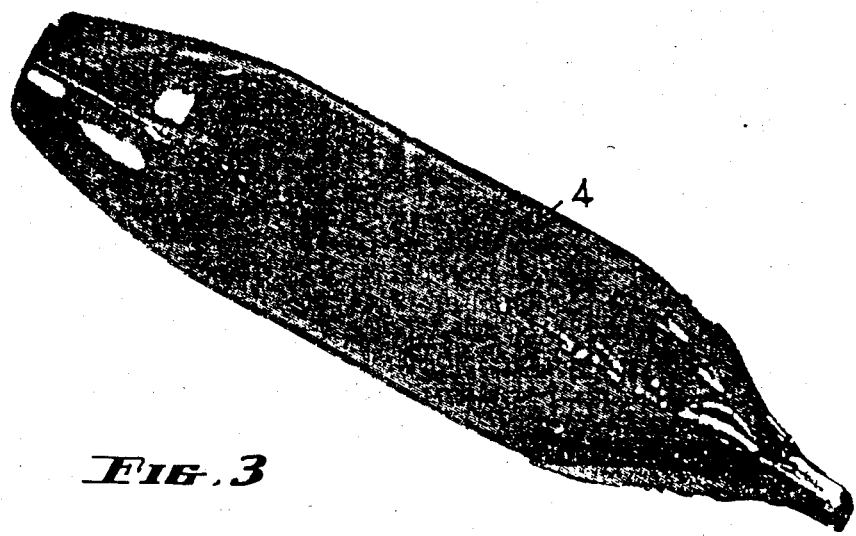
FIG. 3 is a perspective view of a lithium niobate crystal grown with the automatic diameter control.

The degree of diameter control obtained under these condition is typified by the crystal shown in FIG. 3. In FIG. 4, a typical temperature profile for a crystal growth run is shown to illustrate how the control strategy can achieve the long term large temperature changes necessary for the given shape of crystal, while maintaining short term tight diameter control with temperature changes of the order of 1° C.

AUTOMATIC GROWTH OF CALCIUM TUNGSTATE CRYSTALS

Similar diameter control has been obtained on a crystal of calcium tungstate grown under conditions of low thermal gradients but at the necessarily higher melt temperature of around 1650° C. No change was required to the lithium niobate determined control parameters when the after-heater was in position but these proved totally inadequate when the after-heater was not present. In this later case the crystal diameter is much less sensitive to melt temperature changes and it appeared that a constant ramp term and an integral term would be required together with larger constants for the proportional and derivative terms in the control function.

The use of a microprocessor for automatic diameter control in the Czochralski method provides the flexibility of computer control at low cost. The capacity of the microprocessor has not been greatly taxed by the application described here in terms of the data handling speed or programme storage space. It would be possible for the microprocessor to control two or more crystal growing facilities at the same time as well as monitoring various parts of the facilities as a safety precaution.

The application of automatic diameter control has solved a particular problem with 'after-heating' in the growth of lithium niobate but its additional advantage is in freeing staff from the tedious task of crystal watching.

The claims defining the invention are as follows:

1. A method of diameter control in Czochralski crystal growth which comprises the steps of:
   (a) drawing a crystal-forming material from a melt in a crucible at a controlled rate and progressively measuring both the temperature of the melt and the weight of the residue of the melt in the crucible;
   (b) feeding the weight measurement data obtained according to step (a) to a microprocessor of the type including a control algorithm to obtain an output; and
   (c) feeding the temperature measurement and the microprocessor output to a threee term temperature controller which regulates the temperature of the melt and thereby controls automatically the diameter of the crystal.

2. A method of diameter control in Czochralski crystal growth comprising the steps of:
   (a) placing a crystal-forming material into a crucible in a heating zone;
   (b) applying heat to the crucible to provide a melt of the crystal forming material;
   (c) mounting a seed on a rod positioned to dip the seed into the melt;
   (d) lifting the rod at a controlled rate to progressively draw a crystal;
   (e) progressively measuring the temperature of the melt with a temperature sensor;
   (f) progressively measuring the weight of the melt to determine rate of use of the melt and feeding the weight data so obtained to a microprocessor having a control algorithm;
   (g) feeding the output data of both the temperature sensor and the microprocessor to a three term heat controller; and
   (h) controlling the amount of heat applied to said crucible by said applying step (b) with said heat controller to maintain automatically a controlled diameter during the length of growth.

3. The method of claim 2 wherein step (e) is practiced so the said temperature sensor operates in the infrared spectrum and is directed to read the temperature at the interface between the melt and the crystal being pulled.

4. A device for growing a crystal using Czochralski crystal growth comprising:
   a crucible adapted for receiving a crystal forming material;
   means defining a chamber, said crucible disposed in said chamber;

heating means, operatively coupled to said chamber, for heating the crystal forming material contained in the crucible to form a melt thereof;

heat sensor means for progressively recording the temperature of the melt in said crucible and for generating a temperature signal corresponding to the recorded temperature;

weighing means for progressively weighing the contents of the melt in the crucible and for generating a weight signal corresponding to the weight of the melt;

means for holding a seed and for progressively drawing said seed upwards from the melt in the crucible to form a crystal;

data processing means, connected to said weighing means, for receiving said weight signal as input from said weighing means and for progressively converting said weight signal to a heat control factor; and three term controller means, operatively connected to said heat sensor means, said data processing means and said heating means, for receiving said progressive temperature signal from the heat sensor means and the heat control factor from the data processing means and for regulating the heat of the melt in response to said temperature signal and heat control factor to automatically maintain a selected diameter of the crystal.

5. A device for controlling the diameter of a crystal in Czochralski crystal growth comprising:

a thermally insulated chamber;

a weighing platform in said chamber to support a crucible having a crystal forming material therein;

rod means projecting into the said chamber for holding a crystal seed, said rod means including means for withdrawing the rod at a regulated rate;

high-frequency means for heating crystal-forming material in response to a control signal to form a melt of said material in said crucible to be positioned on said platform;

an infrared temperature sensor means directed through a window in the said chamber for generating a temperature signal corresponding to the melt temperature;

electronic weighing means for supporting at least the said platform and for generating a weight signal corresponding to the weight of the melt in said crucible;

comparator means, connected to said weighing means and receiving said weight signal, for comparing the rate of change of crucible weight to preset values and for generating an output signal corresponding to deviation from said preset values to effect appropriate temperature changes; and controller means, operatively connected to said temperature sensor means, said high-frequency means and said comparator means and receiving both the temperature signal from said temperature sensor means and the output signal from said comparator means, for producing said control signal and for applying said control signal to said high-frequency means to thereby progressively control the temperature of the melt in said crucible.

6. Device according to claim 4 wherein said heat sensor means is an infrared sensor directed toward the interface between the melt and the crystal being formed.

7. Device according to claim 5 wherein said temperature sensor means is directed toward the interface between the melt and the crystal being formed.

8. A device for controlling the diameter of a crystal during Czochralski crystal growth comprising:

means defining a chamber to house a crucible containing a crystal-forming material;

heating means for heating the crystal-forming material to form a melt of said material in response to a control output signal;

crystal forming means operatively associated with said chamber for forming a crystal and for withdrawing the crystal from the melt at a preselected rate;

temperature sensor means for sensing the temperature of the melt in the crucible and for generating a corresponding temperature signal;

weight sensing means for progressively sensing the weight of the crucible and for progressively generating a corresponding weight signal; and control means, operatively connected to said heating means, said temperature sensor means and said weight sensing means, said control means including means for converting the progressive weight signal to a rate signal corresponding to the rate of crucible weight change and comparing means for comparing said rate signal to a preselected value to generate a comparison signal corresponding to a deviation of said rate signal from said preselected value, said control means for evaluating said deviation signal and said temperature signal, for responsively generating a control output signal and for applying said control output signal to said heating means, said heating means controlling the temperature of the melt in said crucible whereby the diameter of the crystal being formed is controlled.

* * * * *